United States Patent
Lin et al.

(10) Patent No.: US 10,243,014 B2
(45) Date of Patent: Mar. 26, 2019

(54) SYSTEM-IN-PACKAGE IMAGE SENSOR

(71) Applicant: OmniVision Technologies, Inc., Santa Clara, CA (US)

(72) Inventors: Wei-Feng Lin, Hsinchu (TW); Chi-Chih Huang, Hsinchu (TW); En-Chi Li, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/899,900

(22) Filed: Feb. 20, 2018

(65) Prior Publication Data

US 2018/0182797 A1 Jun. 28, 2018

Related U.S. Application Data

(62) Division of application No. 15/362,408, filed on Nov. 28, 2016, now Pat. No. 9,935,144.

(51) Int. Cl.
*H01L 27/146* (2006.01)

(52) U.S. Cl.
CPC .... *H01L 27/14618* (2013.01); *H01L 27/1469* (2013.01); *H01L 27/14627* (2013.01); *H01L 27/14634* (2013.01); *H01L 27/14636* (2013.01)

(58) Field of Classification Search
CPC ......... H01L 27/14618; H01L 27/14627; H01L 27/14634; H01L 27/14636; H01L 27/1469; H01L 23/053; H01L 23/0753
See application file for complete search history.

(56) References Cited

U.S. PATENT DOCUMENTS

| | | |
|---|---|---|
| 5,532,513 A | 7/1996 | Smith et al. |
| 6,384,473 B1 | 5/2002 | Peterson et al. |
| 8,796,706 B2 | 8/2014 | Jung et al. |
| 8,981,511 B2 | 3/2015 | Kinsman et al. |
| 9,048,391 B2 | 6/2015 | Jung et al. |
| 9,257,624 B2 | 2/2016 | Jung et al. |
| 9,472,743 B2 | 10/2016 | Jung et al. |
| 9,786,827 B2 | 10/2017 | Jung et al. |
| 2005/0051884 A1* | 3/2005 | Stevens ............... H01L 23/055 257/686 |
| 2007/0148807 A1 | 6/2007 | Akram |
| 2007/0152345 A1 | 7/2007 | Wu et al. |

(Continued)

OTHER PUBLICATIONS

Taiwanese Office Action and Translation dated Sep. 13, 2018, for Taiwanese Application No. 106141083, filed Nov. 27, 2017, 17 pages.

(Continued)

*Primary Examiner* — Nathan W Ha
(74) *Attorney, Agent, or Firm* — Christensen O'Connor Johnson Kindness PLLC

(57) ABSTRACT

A method of image sensor package fabrication includes forming a cavity in a ceramic substrate, and placing an image sensor in the cavity in the ceramic substrate. An image sensor processor is also placed in the cavity in the ceramic substrate, and the image sensor and the image sensor processor are wire bonded to electrical contacts. Glue is deposited on the ceramic substrate, and a glass layer is placed on the glue to adhere the glass layer to the ceramic substrate. The image sensor processor and the image sensor are disposed in the cavity between the glass layer and the ceramic substrate.

5 Claims, 8 Drawing Sheets

(56) References Cited

U.S. PATENT DOCUMENTS

| | | | |
|---|---|---|---|
| 2008/0315386 A1* | 12/2008 | Kudo | H01L 25/105 |
| | | | 257/686 |
| 2012/0056217 A1 | 3/2012 | Jung et al. | |
| 2012/0262903 A1 | 10/2012 | Li et al. | |
| 2013/0015478 A1 | 1/2013 | Oh et al. | |
| 2013/0062591 A1 | 3/2013 | Jun et al. | |
| 2014/0048951 A1* | 2/2014 | Lin | H01L 23/481 |
| | | | 257/774 |
| 2014/0117473 A1* | 5/2014 | Kierse | H01L 29/84 |
| | | | 257/416 |
| 2014/0264395 A1 | 9/2014 | Lee et al. | |
| 2015/0060932 A1 | 3/2015 | Huang et al. | |
| 2016/0126221 A1 | 5/2016 | Windisch et al. | |
| 2016/0149088 A1 | 5/2016 | Yan et al. | |
| 2016/0291265 A1* | 10/2016 | Kinghorn | G02B 6/131 |

OTHER PUBLICATIONS

Taiwanese Office Action and Translation dated Dec. 26, 2018 for Taiwanese Application No. 106141083, filed Nov. 27, 2017, 13 pages.

* cited by examiner

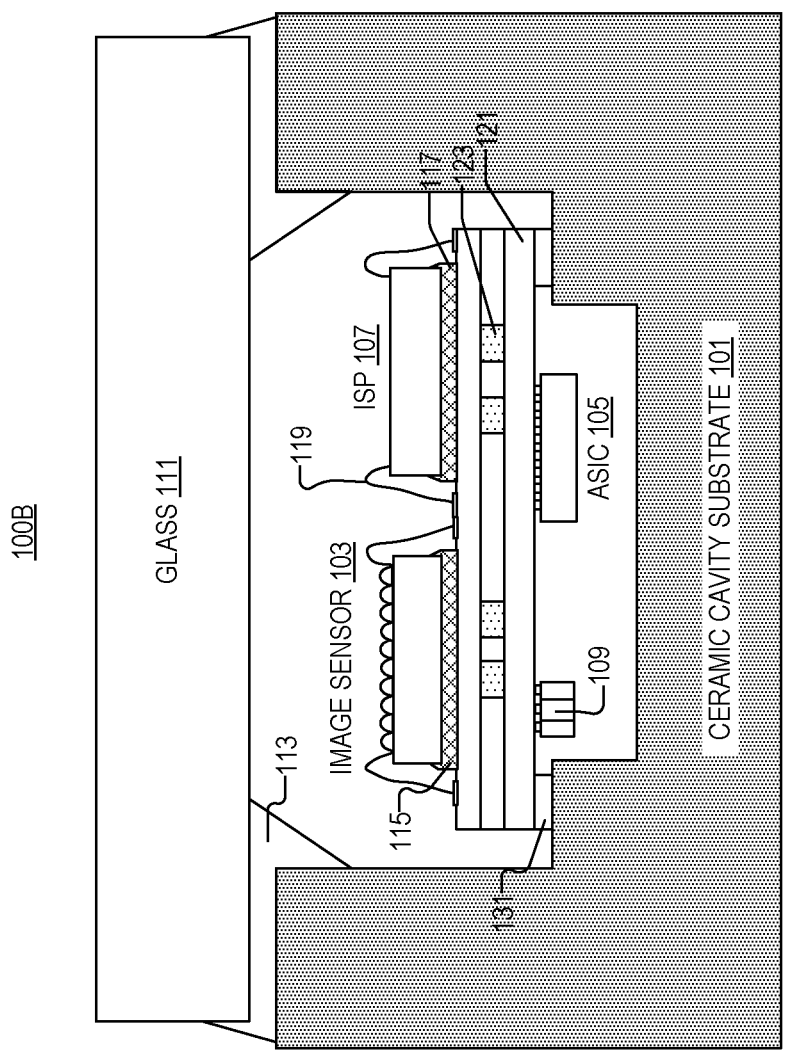

SYSTEM-IN-PACKAGE IMAGE SENSOR

REFERENCE TO RELATED APPLICATION

This application is a divisional of U.S. application Ser. No. 15/362,408, filed on Nov. 28, 2016, the contents of which are incorporated herein by reference.

TECHNICAL FIELD

This disclosure relates generally to semiconductor device packaging, and in particular but not exclusively, relates to image sensor packaging.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

In order to produce high quality images, the image sensor needs to be sufficiently electrically isolated to prevent unwanted electrical distortion. Conventional packaging materials may not possess adequate insulative properties for modern sensors. Accordingly, new packaging materials may be used.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 1B is a cross sectional illustration of an image sensor package, in accordance with the teachings of the present invention.

Figure 1A:
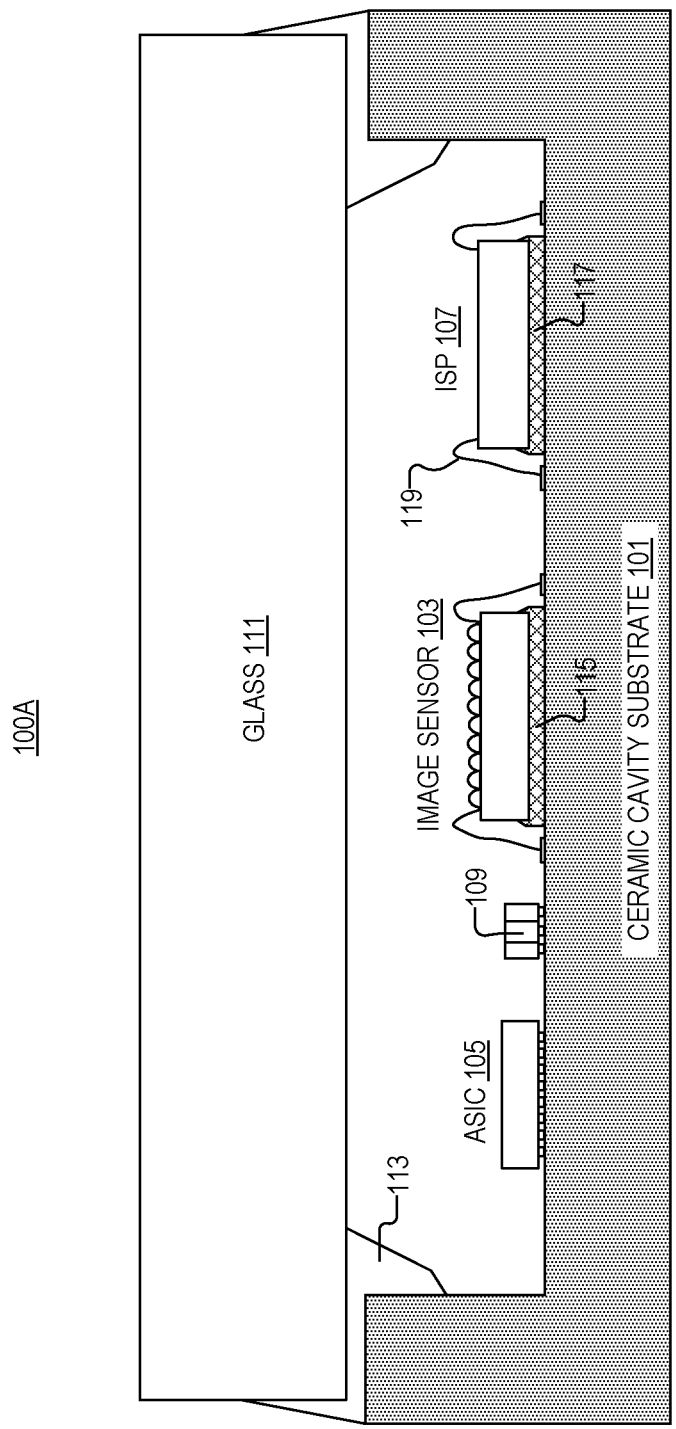
FIG. 1A is a cross sectional illustration of an image sensor package, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a system-in-package image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1A is a cross sectional illustration of image sensor package 100A. Image sensor package 100A includes ceramic substrate 101, image sensor 103, application-specific integrated circuit (ASIC) 105, image sensor processor 107, component 109, glass layer 111, adhesives 113-117, and wire bond 119. One of skill in the art will appreciate that many of the components depicted may be substituted for other components, in accordance with the teachings of the present disclosure. However, ceramic substrate 101 may convey greater electrical isolation and enhanced mechanical properties over conventional semiconductor packaging materials.

Ceramic substrate 101 has a cavity disposed within it, and glass layer 111 is adhered to ceramic substrate 101 and encloses the cavity. Image sensor 103 is disposed in the cavity between glass layer 111 and ceramic substrate 101 so that image sensor 103 is electrically isolated. Image sensor processor (ISP) 107 is disposed in the cavity and electrically coupled to image sensor 103 to receive image data from image sensor 103. In one example ISP 107 may process the raw image data into a data type usable by an electronic device, or may even manipulate the image data by applying post image effects (e.g., crop, rotate, remove red eye, adjust brightness, adjust contrast, or otherwise). As depicted, glass layer 111 is disposed proximate to an illuminated side of image sensor 103, and glass layer 111 is glued (via adhesive 113) to elevated portions of ceramic substrate 101. In other words, in the depicted example, glass layer 111 is glued to the walls of the cavity so that there is an air gap or vacuum between image sensor 103 and glass layer 111. Image sensor 103 also includes a plurality of microlenses disposed on the illuminated surface of image sensor 103 so that the microlenses are disposed between glass layer 111 and image sensor 103.

In the depicted example, application-specific integrated circuit (ASIC) 105 is disposed in the cavity in ceramic substrate 101, and is coupled to at least one of image sensor 103 or image sensor processor 107 depending on how image sensor package 100A is used (e.g., cell phone, partially or fully autonomous car, computer, etc.). In one example, ASIC 105 may include field programmable gate arrays.

Also shown in FIG. 1A is component 109, which may be another piece of circuitry used to control image sensor 103 or may control the power supplied to image sensor 103. As depicted, ASIC 105, image sensor 103, image sensor processor 107, and component 109 are disposed on a level plane within the cavity on ceramic substrate 101. Moreover, ceramic substrate 101 includes contact pads disposed on the ceramic substrate 101; image sensor 103 and image sensor processor 107 are wire bonded to the contact pads via wire bonds 119.

FIG. 1B is a cross sectional illustration of an image sensor package 100B. Image sensor package 100B is similar in many respects to image sensor package 100A. However, image sensor package 100B includes ledges disposed in the cavity of ceramic substrate 101, and interposer 121 is disposed on the ledges such that interposer 121 spans the gap between the ledges. Moreover, image sensor 103, image sensor processor 107, and ASIC 105 are disposed on interposer 121. As shown, image sensor 103 and image sensor processor 107 are disposed between glass layer 111 and interposer 121; ASIC 105 and component 109 are disposed between ceramic substrate 101 and interposer 121. In the illustrate example, ASIC 105 is vertically aligned with ISP 107, while component 109 is vertically aligned with image sensor 103. Interposer 121 may either be plastic with metal components 123 (which may be disposed between two pieces of plastic), or may include silicon depending on the desired properties of interposer 121. Moreover, interposer 121 may be mounted on the ledges with adhesive 131. In the depicted example, metal components 123 may include electrical interconnects to couple image sensor 103 to image sensor processor 107 and ASIC 105.

Figure 1C:
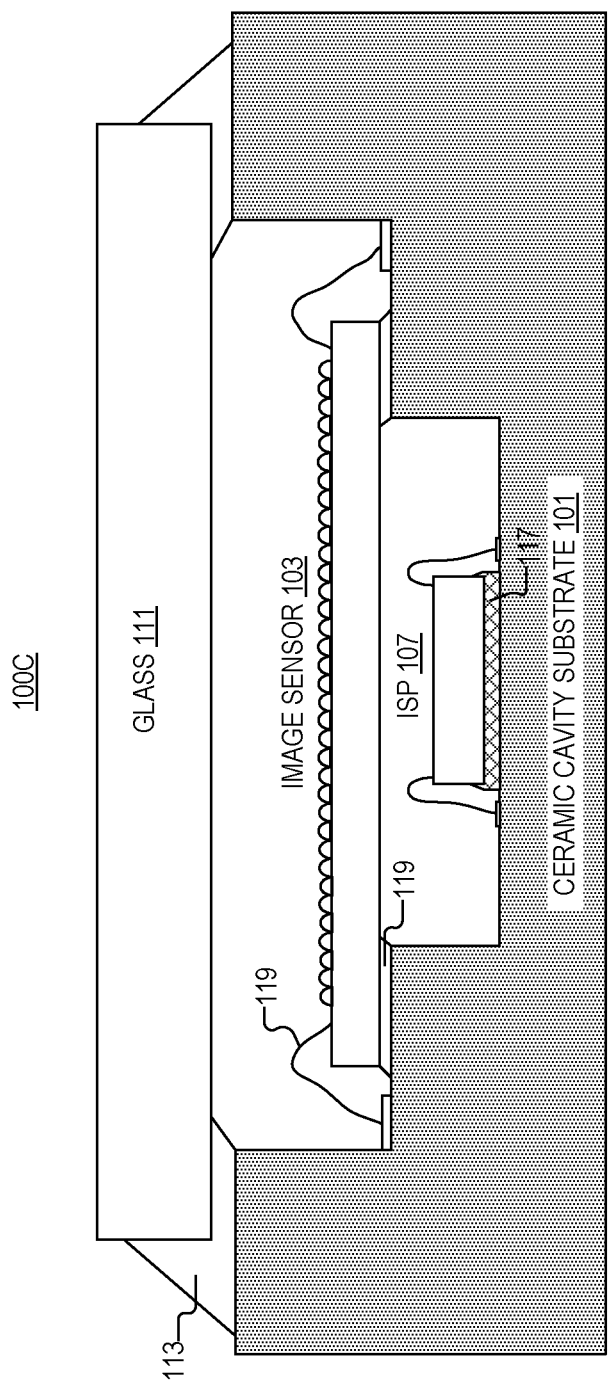
FIG. 1C is a cross sectional illustration of an image sensor package, in accordance with the teachings of the present invention.

FIG. 1C is a cross sectional illustration of image sensor package 100C, in accordance with the teachings of the present invention. Image sensor package 100C is similar in many respects to image sensor package 100A and 100B. However, rather than an interposer being disposed on ledges, image sensor 103 is disposed on the ledges and spans a gap between the ledges. Moreover image sensor processor 107 is disposed on ceramic substrate 101 between image sensor 103 and ceramic substrate 101. In other words, image sensor processor 107 is disposed in a second cavity between the two ledges. Image sensor 103 is disposed between image sensor processor 107 and glass layer 111 in a vertical direction. As illustrated, glass layer 111, image sensor 103, and image sensor processor 107 are optically aligned so that image light is directed through glass layer 111, is incident on image sensor 103, and light is blocked from reaching image sensor processor 107. In the depicted example, image sensor processor 107 is adhered to ceramic substrate 101 with adhesive 117.

FIGS. 2A-2E illustrate a method of image sensor package fabrication, in accordance with the teachings of the present invention. The order in which some or all process figures appear in the method should not be deemed limiting. Rather, one of ordinary skill in the art having the benefit of the present disclosure will understand that some of the method may be executed in a variety of orders not illustrated, or even in parallel. Furthermore, the method may omit certain figures in order to avoid obscuring certain aspects. Alternatively, the method may include additional figures that may not be necessary in some embodiments/examples of the disclosure.

Figure 2A:
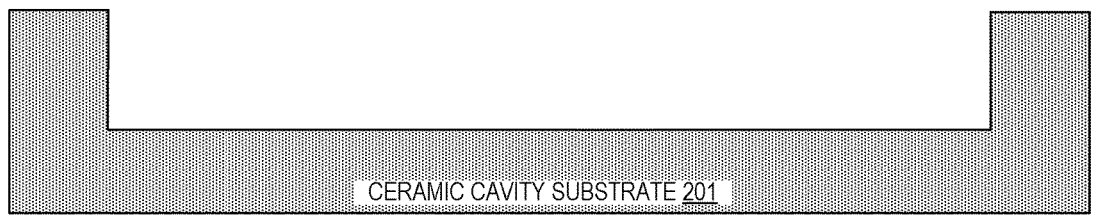
FIGS. 2A-2E illustrate a method of image sensor package fabrication, in accordance with the teachings of the present invention.

FIG. 2A shows forming a cavity in ceramic substrate 201. This may include taking a block of ceramic and etching a trench into the substrate. Alternatively, the ceramic may be pressed/sintered, slip cast, or the like to form the desired shape. One of ordinary skill in the art will appreciate that many techniques and materials may be used to form ceramic substrate 201. For example, ceramic substrate 201 may include oxides of aluminum, silicon, zinc, or the like.

Figure 2B:
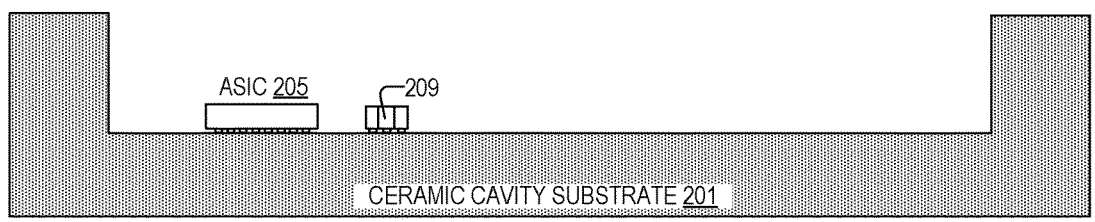

FIG. 2B illustrates placing application-specific integrated circuit (ASIC) 205 and component 209 into the cavity in ceramic substrate 201. In the depicted example, both ASIC 205 and component 209 may have solder balls on the bottom and may be coupled to electrical contacts on ceramic substrate 201.

Figure 2C:
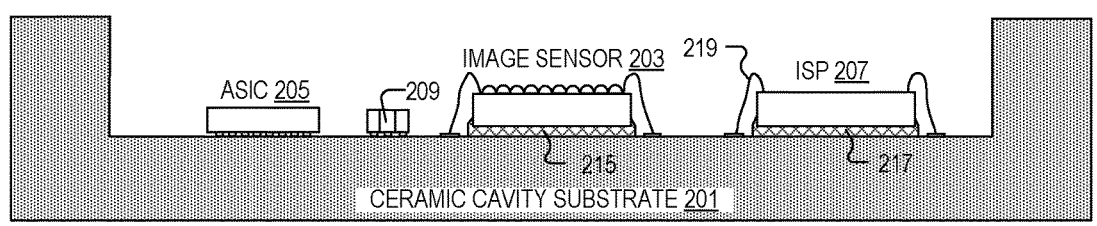

FIG. 2C depicts placing image sensor 203 and image sensor processor 207 in the cavity in ceramic substrate 201. In the depicted example, image sensor 203 and image sensor processor 207 are wire bonded 219 to electrical contacts disposed on the ceramic cavity. As shown ASIC 205, image sensor 203, and image sensor processor 207 are disposed on a level plane within the cavity.

Figure 2D:
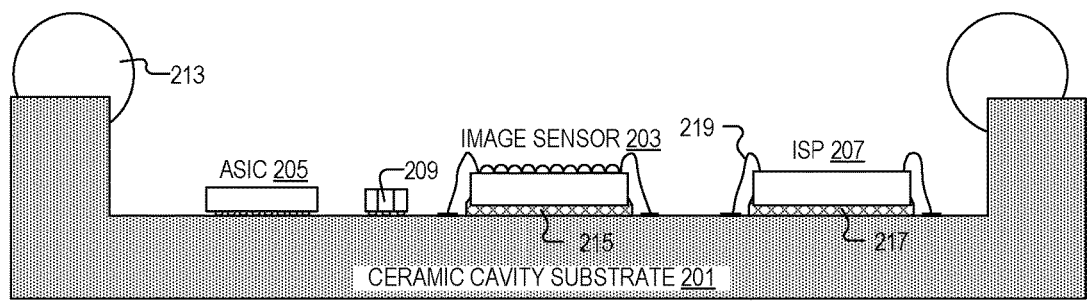

FIG. 2D shows depositing glue 213 on ceramic substrate 201. In one example, glue 213 may be an epoxy or the like. However, in other examples the glue 213 may be optically or thermally cross-linkable.

Figure 2E:
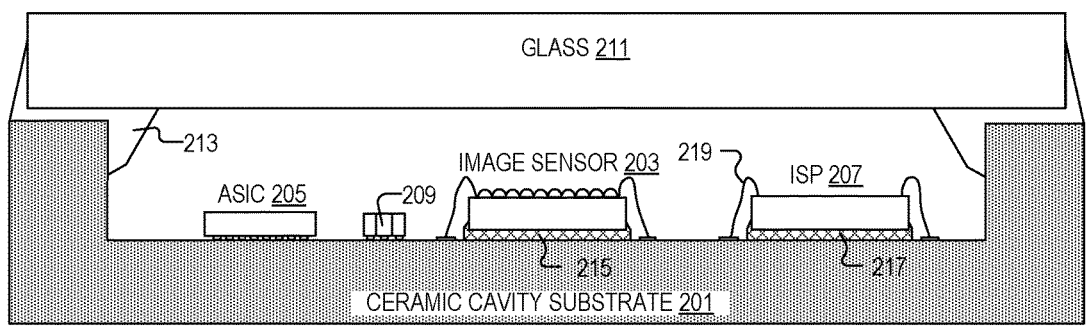

FIG. 2E illustrates placing glass layer 211 on glue 213 to adhere glass layer 211 to ceramic substrate 201. Thus, image sensor processor 207 and image sensor 203 are disposed in the cavity between glass layer 211 and ceramic substrate 201. This encapsulates image sensor 203 allowing for an electrically isolated and mechanically robust image sensor package.

FIGS. 3A-3E illustrate a method of image sensor package fabrication, in accordance with the teachings of the present invention. The order in which some or all process figures appear in the method should not be deemed limiting. Rather, one of ordinary skill in the art having the benefit of the present disclosure will understand that some of the method may be executed in a variety of orders not illustrated, or even in parallel. Furthermore, the method may omit certain figures in order to avoid obscuring certain aspects. Alternatively, the method may include additional figures that may not be necessary in some embodiments/examples of the disclosure.

Figure 3A:
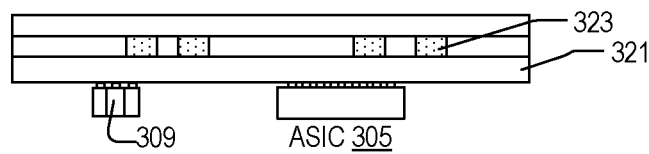
FIGS. 3A-3E illustrate a method of image sensor package fabrication, in accordance with the teachings of the present invention.

FIG. 3A shows mounting an ASIC 305 and component 309 to interposer 321. Interposer 321 may be either plastic with metal 323, or silicon depending on design considerations.

Figure 3B:
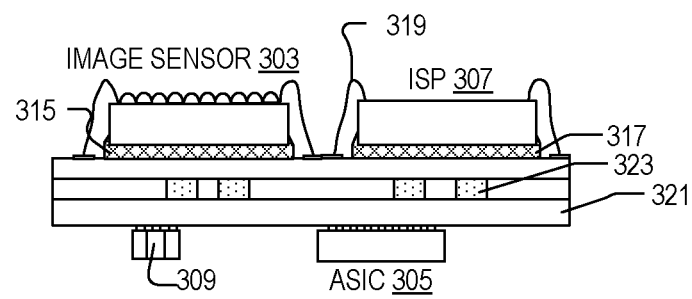

FIG. 3B illustrates mounting image sensor 303 and image sensor processor 307 on the opposite side of interposer 321. Thus, image sensor 303 and image sensor processor 307 are disposed on the illuminated side of interposer 321, and ASIC 305 and component 309 are disposed on a non-illuminated side. All of the aforementioned components may be wire bound 319 to interposer 321.

Figure 3C:
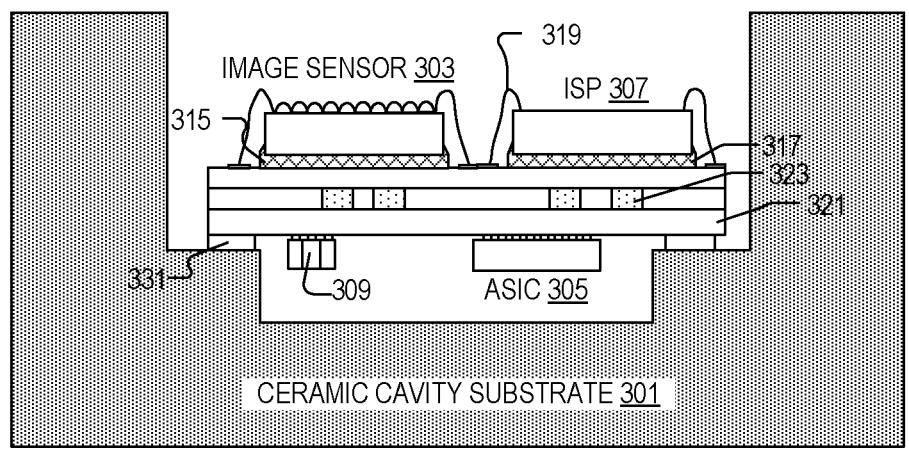

FIG. 3C depicts adhering interposer 321 to ceramic substrate 301. In the depicted example interposer 321 is adhered to ceramic substrate 301 with adhesive 331. In one example, placing an interposer 321 in the cavity includes placing it on ledges disposed within the cavity in ceramic substrate 301. As shown, ASIC 305 and component 309 are disposed, at least in part, in a second cavity disposed between the two ledges.

Figure 3D:
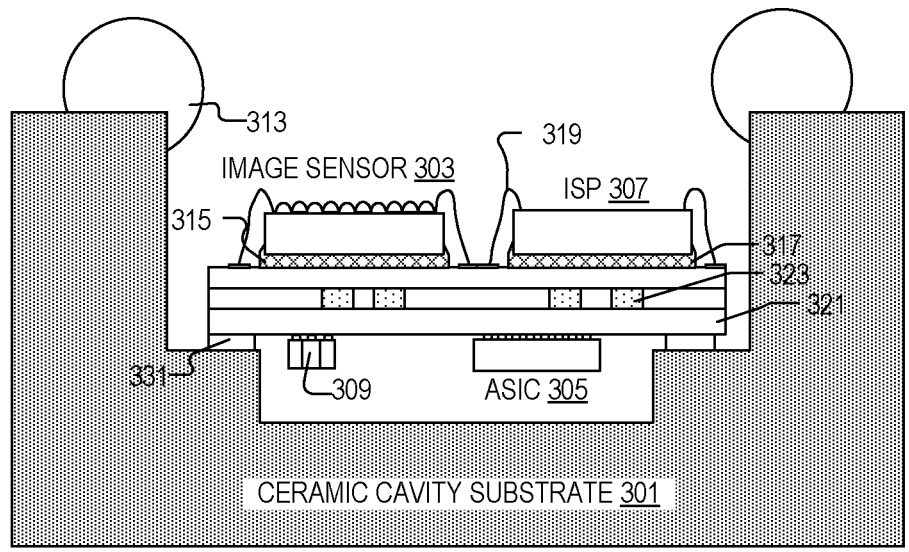

FIG. 3D shows applying glue 313 to the ledges of the ceramic substrate 301. Glue 313 can be dispensed with an automated glue gun or any other apparatus.

Figure 3E:
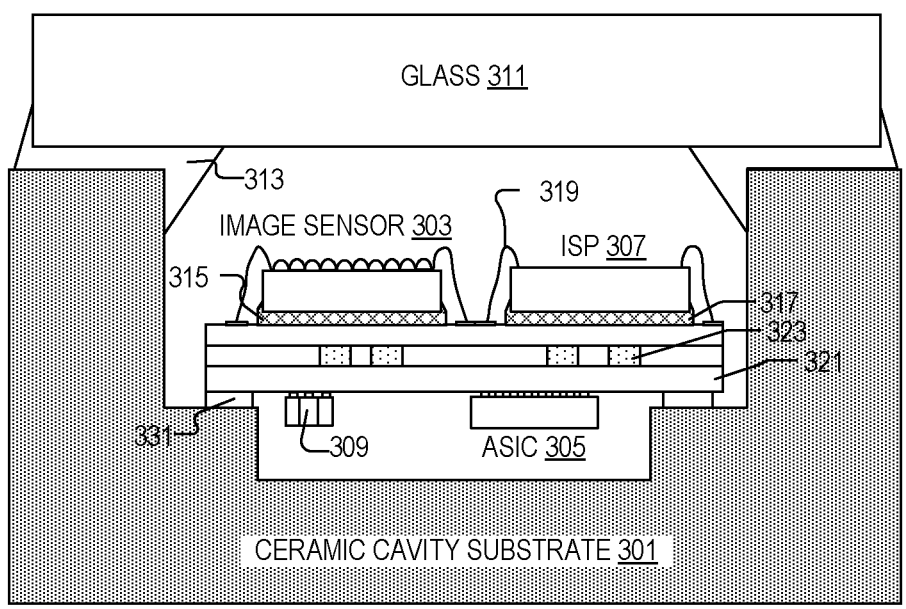

FIG. 3E illustrates adhering glass layer 211 to ceramic substrate 201 with glue 213.

Figure 4:
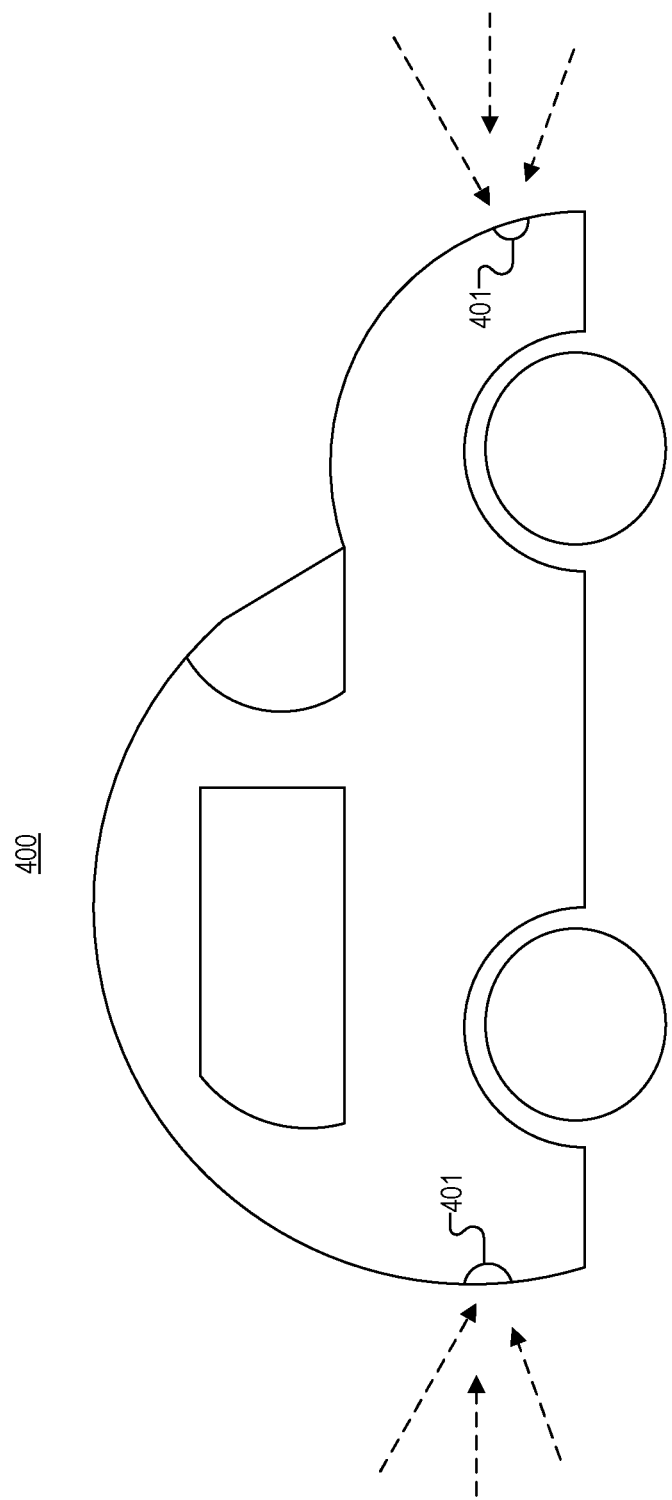
FIG. 4 illustrates a car that is at least in part autonomous which may contain the image sensor packages of FIGS. 1A-1C, in accordance with the teachings of the present invention.

FIG. 4 illustrates car 400 that is at least in part autonomous which may contain the image sensor packages 401 of FIGS. 1A-1C. In one example, car 400 may use image sensors 401 to park itself. In other examples, car 400 may drive itself with little or no human intervention. The image sensors 401 may relay optical information about the position of car 400 to processors contained within the car 400. This may allow for car 400 to accurately position itself in traffic. The ceramic housings of image sensor packages 401 may guard against mechanical, chemical, and electromagnetic disruption of clear image acquisition. For instance, the ceramic and glass housing may prevent damage to critical sensing components in an accident, thereby allowing car 400 to still maneuver itself to the side of the road and out of harm's way. Moreover, the ceramic packaging my help prevent chemical degradation (e.g., preventing road salt from corroding connections).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor package fabrication, comprising:
    forming a cavity in a ceramic substrate;
    placing an image sensor in the cavity in the ceramic substrate;
    placing an image sensor processor in the cavity in the ceramic substrate;
    wire bonding the image sensor and the image sensor processor to electrical contacts;
    depositing glue on the ceramic substrate; and
    placing a glass layer on the glue to adhere the glass layer to the ceramic substrate, wherein the image sensor processor and the image sensor are disposed in the cavity between the glass layer and the ceramic substrate;
    placing an interposer in the cavity, wherein the cavity includes ledges and wherein the interposer is attached to the ledges of the ceramic substrate, wherein placing the image sensor and the image sensor processor in the cavity includes wire bonding the image sensor and the image sensor processor to the interposer, and wherein the image sensor and the image sensor processor are disposed on an illuminated side of the interposer, and wherein an application-specific integrated circuit is disposed on a dark side of the interposer opposite the illuminated side.

2. The method of claim 1, wherein the interposer includes silicon.

3. A method of image sensor package fabrication, comprising:
    forming a cavity in a ceramic substrate;
    placing an image sensor in the cavity in the ceramic substrate;
    placing an image sensor processor in the cavity in the ceramic substrate;
    wire bonding the image sensor and the image sensor processor to electrical contacts;
    depositing glue on the ceramic substrate; and
    placing a glass layer on the glue to adhere the glass layer to the ceramic substrate, wherein the image sensor processor and the image sensor are disposed in the cavity between the glass layer and the ceramic substrate, wherein the cavity includes ledges, and wherein the image sensor is placed on the ledges so that the image sensor is disposed between the glass layer and the image sensor processor, wherein the image sensor processor is disposed on a planar surface of the ceramic substrate.

4. The method of claim 3, wherein wire bonding includes wire bonding to contact pads disposed in the cavity in the ceramic substrate.

5. A method of image sensor package fabrication, comprising:
    forming a cavity in a ceramic substrate;
    placing an image sensor in the cavity in the ceramic substrate;
    placing an image sensor processor in the cavity in the ceramic substrate;
    wire bonding the image sensor and the image sensor processor to electrical contacts;
    depositing glue on the ceramic substrate; and
    placing a glass layer on the glue to adhere the glass layer to the ceramic substrate, wherein the image sensor processor and the image sensor are disposed in the cavity between the glass layer and the ceramic substrate;
    placing an application-specific integrated circuit in the cavity in the ceramic substrate and wire bonding the application-specific integrated circuit to the electrical contacts, wherein the application-specific integrated circuit, the image sensor, and the image sensor processor are disposed on a level plane within the cavity so that the image sensor is disposed between the application-specific integrated circuit and the image sensor processor.

* * * * *